United States Patent [19]

Kitahara

[11] Patent Number: 5,276,855

[45] Date of Patent: Jan. 4, 1994

[54] LOGIC SYNTHESIS APPARATUS FOR INCORPORATING ADDITIONAL RULES TO THE KNOWLEDGE BASE WITHOUT CAUSING COMPETITION

[75] Inventor: Takeshi Kitahara, Kanagawa, Japan

[73] Assignee: Kabushiki Kaisha Toshiba, Kawasaki, Japan

[21] Appl. No.: 587,741

[22] Filed: Sep. 25, 1990

[30] Foreign Application Priority Data

Sep. 29, 1989 [JP] Japan .................................. 1-252425

[51] Int. Cl.⁵ ...................... G06F 15/18; G06F 15/60
[52] U.S. Cl. ...................................... 395/500; 395/10; 395/50; 395/75; 364/274.3; 364/274.5; 364/275.6; 364/DIG. 1; 364/488; 364/489
[58] Field of Search ........................ 364/513, 488–491; 395/800, 500, 75, 50, 54, 10

[56] References Cited

U.S. PATENT DOCUMENTS

| | | | |
|---|---|---|---|
| 4,703,435 | 10/1987 | Darringer et al. ................... | 364/489 |
| 4,803,636 | 2/1989 | Nishiyama et al. ................. | 364/491 |
| 4,896,272 | 1/1990 | Kurosawa ........................... | 364/491 |
| 4,942,536 | 7/1990 | Watanabe et al. .................. | 364/490 |
| 4,970,657 | 11/1990 | Wolf .................................... | 364/513 |
| 4,982,357 | 1/1991 | Bechade ............................. | 364/788 |
| 4,987,538 | 1/1991 | Johnson et al. ..................... | 364/401 |
| 5,003,487 | 3/1991 | Drumm et al. ..................... | 364/489 |
| 5,095,441 | 3/1992 | Hopper et al. ..................... | 364/489 |
| 5,187,784 | 2/1993 | Rowson .............................. | 395/500 |

*Primary Examiner*—Thomas C. Lee
*Assistant Examiner*—Alpesh M. Shah
*Attorney, Agent, or Firm*—Foley & Lardner

[57] ABSTRACT

Disclosed is a logic synthesis apparatus for automatically composing and designing LSI logic circuits by converting a functional specification based on conversion rules given in advance to the apparatus, which is composed of means for inputting an additional transformation rule, means for executing logic composition of LSI by applying the additional transformation rule to the functional specification preferentially to the conversion rules, and means for revising the conversion rules so as to avoid competition between the conversion rules and the additional transformation rule by analyzing the additional conversion rule, and incorporating the additional transformation rule in the conversion rules, thereby obtaining a learning function to the additional transformation rule.

3 Claims, 7 Drawing Sheets

FUNCTION OF DECODOR

| INPUT VALUE | TARGET CORRESPONDING TO OUTPUT VALUE OF "1" |
|---|---|
| 0 | T1 |
| 1 | T2 |
| 2 | T3 |
| 3 | T4 |
| 4 | T5 |
| 5 | T6 |
| 6 | T7 |
| 7 | T8 |

RULE-a

THE INPUT BIT WIDTH OF THE DECODER IS 1, OR 3 OR MORE

DEVELOPED INTO A COMBINATION OF AND/OR/NOT

RULE-b

THE INPUT BIT WIDTH OF THE DECODER IS 2

THE CELL α 2-BIT INPUT DECODER IS ASSIGNED

CONVERSION RULE RELATED TO THE DECODER

CELL β

TABLE OF TRUTH VALUE

| INPUT VALUE | | | OUTPUT TERMINAL CORRESPONDING TO OUTPUT VALUE OF "1" |
|---|---|---|---|
| A | B | C | |
| 0 | 0 | 0 | Z0 |
| 1 | 0 | 0 | Z1 |
| 0 | 1 | 0 | Z2 |
| 1 | 1 | 0 | Z3 |
| 0 | 0 | 1 | Z4 |
| 1 | 0 | 1 | Z5 |
| 0 | 1 | 1 | Z6 |
| 1 | 1 | 1 | Z7 |

SPECIFICATION OF THE CELL β

RULE-c

THE INPUT-BIT WIDTH OF THE DECODER IS 3

THE CELL $\beta$, 3-BIT INPUT DECODER IS ASSIGNED

ADDITIONAL CONVERSION RULE

RULE-c

ADDITIONAL CONVERSION
RULE : RULE c

OBJECTIVE ELEMENT :
FUNCTIONAL ELEMENT DECODER

INPUT BIT WIDTH : 3

RULE-a

THE INPUT BIT WIDTH OF THE
DECODER IS 1, OR 4 OR MORE

DEVELOPED INTO A
COMBINATION OF AND/OR/NOT

FIG.10

RULE-a

> THE INPUT BIT WIDTH
> OF THE DECODER IS
> 1 ,OR 4 OR MORE
>
> DEVELOPED INTO A
> COMBINATION OF
> AND/OR/NOT

RULE-b

> THE INPUT BIT WIDTH OF
> DECODER IS 2
>
> THE CELL $\alpha$ , 2-BIT
> INPUT DECODER IS ASSIGNED RULE-c > THE INPUT BIT WIDTH OF
> DECODER IS 3
>
> THE CELL $\beta$ , 3-BIT
> INPUT DECODER IS ASSIGNED

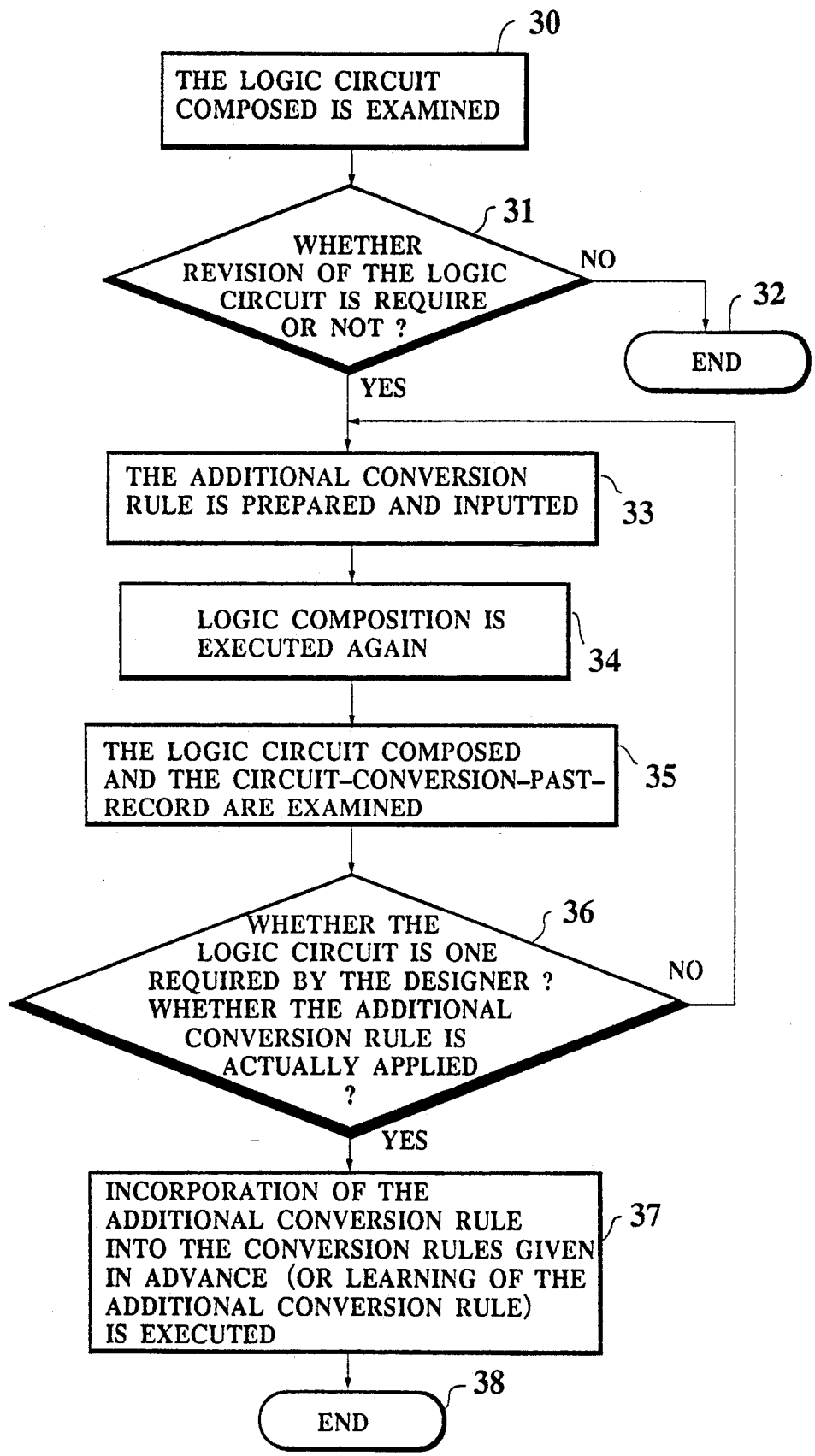

LOGIC SYNTHESIS APPARATUS FOR INCORPORATING ADDITIONAL RULES TO THE KNOWLEDGE BASE WITHOUT CAUSING COMPETITION

BACKGROUND OF THE INVENTION

1. Field of the Invention

This invention relates to a logic synthesis apparatus for composing a logic circuit to be designed based on a functional specification of the logic circuit, and particularly to a logic synthesis circuit having an automatic learning function for incorporating an additional transformation rule in a group of conversion rules given in advance to the apparatus without causing competition to the group of conversion rules.

2. Description of the Prior Art

With the improvement of the integrating technology, LSI logic circuits become more large-scale and complicated. Therefore, the design work for the circuits becomes more complex and requires much more time. Accordingly, there is a proposition to provide a logic synthesis apparatus having a group of conversion rules as a knowledge base for producing a logic circuit with a function when a functional specification for representing the function is inputted, so as to enable automatically composing a logic circuit only by inputting the functional specification. By using this apparatus, it is attempted to easily design a logic circuit and reduce the design time.

In such a logic synthesis apparatus, the group of conversion rules as a knowledge base is composed of conversion rules required for producing a logic circuit in accordance with a functional specification. The group of conversion rules is obtained by expressing a method ordinarily used for designing logic circuits by producing a logic circuit from a functional specification as conversion rules, and gathering the conversion rules into a group. To make the logic synthesis apparatus applicable to the designers in common as widely as possible, the number of the conversion rules to be incorporated in the apparatus is minimized as far as the logic design is possible. Accordingly, by this apparatus, even when the designers are different, the same logic circuit can be obtained as far as the functional specification is the same. However, because of difference in design approaches by designers, even when the functional specification is the same, the logic circuits to be realized by them are occasionally different. Therefore, even though it is attempted to design the same logic circuit, the difference caused by respective designing approach of designers must be examined in detail. However, it is very difficult and troublesome to minutely discriminate the difference.

While, composing a logic circuit designed along each designing approach of designers, it is necessary to add a transformation rule original for the designer to the group of conversion rules as a knowledge base. However, in this case, it is necessary to consider the coordination or matching property between the additional transformation rule and the group of conversion rules given in advance. Namely, when the additional transformation rule is added to the knowledge base, the additional rule must be incorporated therein after the group of conversion rules is revised so as to avoid the competition between the additional rule and the group of conversion rules. Accordingly, the designer must examine the function of the group of conversion rules given in advance, and revise it along the above object, further add the additional transformation rule thereto. As the result, it becomes very troublesome for the designer, particularly for one who is not an expert of the knowledge base design, to do this work.

As mentioned above, when a logic circuit designed along each designing way of circuit designers is composed by the conventional logic synthesis apparatus, the designer must take extremely much trouble to carry out the addition or alteration to the knowledge base.

SUMMARY OF THE INVENTION

This invention was invented to solve the problem of the prior art. Therefore, it is an object of the present invention to provide a logic synthesis apparatus which can realize easy addition of the original transformation rule to the knowledge base and easy alteration of the latter to the former, so as to compose a logic circuit along each designing way of circuit designers.

Namely, this invention is characterized by a logic synthesis apparatus for automatically synthesizing and designing LSI logic circuits by transforming a functional specification based on a group of transformation rules given in advance, i.e., the knowledge base, which comprises means for inputting an additional transformation rule, means for executing logic synthesis of LSI by applying the additional transformation rule to the functional specification preferentially to the knowledge base, and means for revising the group of transformation rules stored in the knowledge base to avoid competition between the knowledge base and the additional transformation rule by analyzing the additional transformation rule, and incorporating the additional transformation rule into the knowledge base, so as to have a learning function to the additional transformation rule.

According to the construction described above, when an original transformation rule of a designer is inputted from the inputting means of the additional transformation rule and a functional specification for a circuit to be designed by the logic synthesis apparatus is inputted from the inputting means of the circuit information, the executing means of the logic composition processes the additional transformation rule to the functional specification preferentially to the conversion rules given in advance so as to carry out the logic composition.

Thereafter, when the logic composition can be so made as expected by the designer, the additional conversion rule is analyzed. While, when it can not be so made, the past record of circuit conversion is examined to revise the additional rule and execute the circuit composition again after revising the additional rule. Then, contents of the additional transformation rule are automatically analyzed, and the group of conversion rules given in advance is revised in case of need based on the analysis result to avoid competition between the additional rule and the group of conversion rules given in advance. Subsequently, the additional transformation rule is incorporated in the group of conversion rules. In this manner, the additional transformation rule is automatically learned by the logic synthesis apparatus, and incorporated in the group of conversion rules without causing competition therebetween. Accordingly, it is possible to provide a logic synthesis apparatus which can realize an easy adding process of the additional transformation rule and match with each design approach of designers without requiring any special process.

These and other objects, features and advantages of the present invention will be more apparent from the following description of a preferred embodiment, taken in conjunction with the accompanying drawings.

BRIEF DESCRIPTION OF THE DRAWINGS

FIG. 10 is a diagram to show an example for incorporating the additional transformation rule into the group of conversion rules given in advance;

FIG. 11 is a flow-chart to show a procedure for executing learning of the transformation rule.

DETAILED DESCRIPTION OF THE EMBODIMENT

Figure 1:
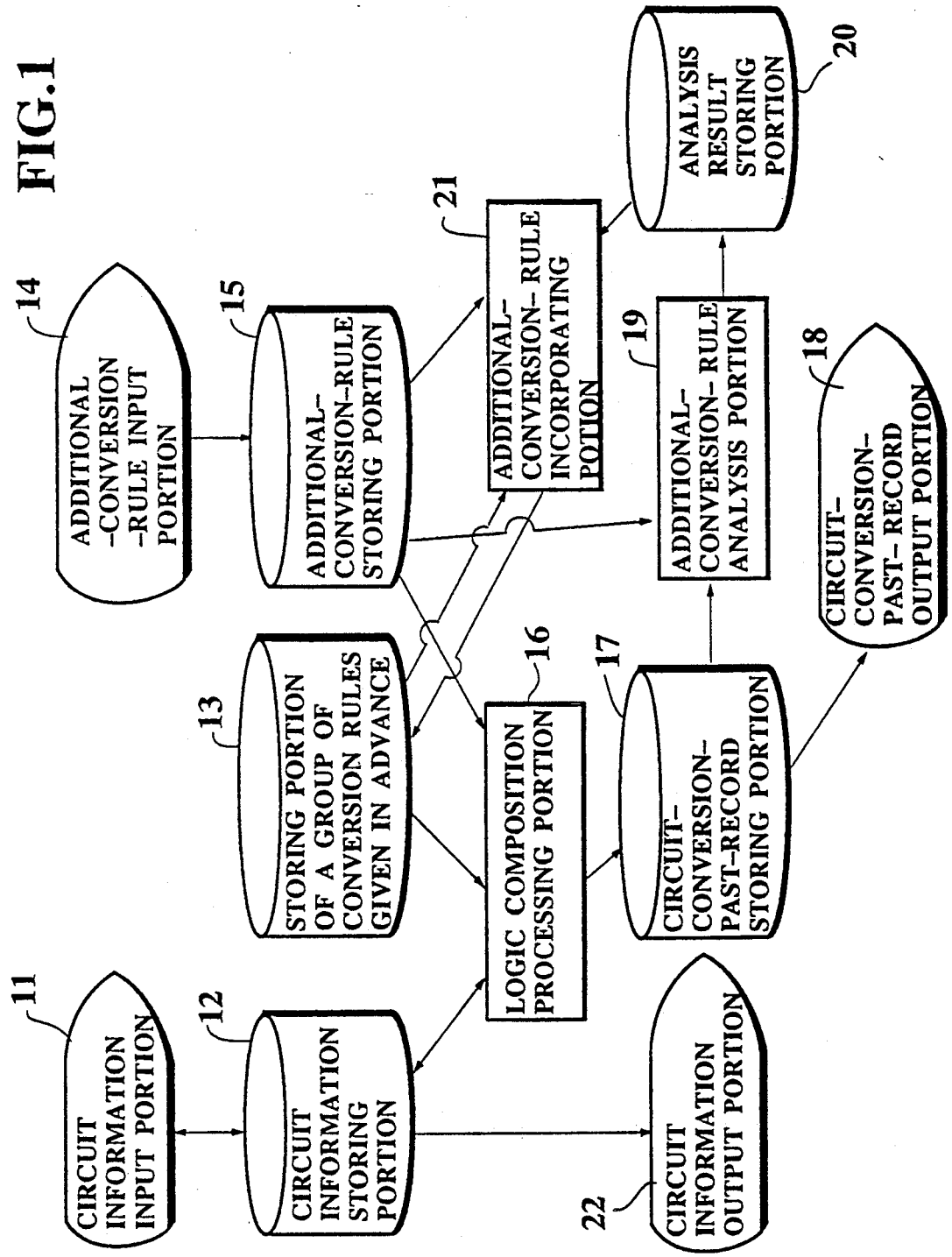
FIG. 1 is a block diagram to show construction of a logic synthesis apparatus related to an embodiment of the present invention.

FIG. 1 is a block diagram to show a logic synthesis apparatus related to an embodiment of the present invention. As shown in FIG. 1, the logic synthesis apparatus includes a circuit information input portion 11 for inputting a functional specification of a circuit to be composed, a circuit information storing portion 12 for storing the functional specification of a circuit inputted through the input portion 11 as a form of information for connecting between elements, a storing portion 13 for storing conversion rules given in advance, an additional-conversion-rule input portion 14 for inputting an additional transformation rule, an additional-conversion-rule storing portion 15 for storing the additional transformation rule inputted through the input portion 14, and a logic composing portion 16. The logic synthesis portion 16 composes a logic circuit by applying the conversion rules stored in the respective storing portions 13, 15 to the functional specification stored in the circuit information storing portion 12. At the time, the additional transformation rule is applied preferentially to the conversion rules given in advance.

Moreover, the logic synthesis apparatus has a circuit-conversion-past-record storing portion 17, a circuit-conversion-past-record output portion 18, an additional-conversion-rule analyzing portion 19, an analysis-result storing portion 20 and an additional-conversion-rule incorporating portion 21, so as to learn the additional transformation rule.

The circuit-conversion-past-record storing portion 17 stores conversion rules applied in the logic synthesis portion 16 and information before and after conversion of a circuit portion to be processed. The contents of the circuit-conversion-past-record storing portion 17 are outputted to the circuit-conversion-past-record output portion 18, then displayed to a designer. Accordingly, by monitoring the output portion 18, the designer can recognize whether the additional transformation rule has an expected function.

The additional-conversion-rule analyzing portion 19 analyzes a function of the additional transformation rule based on the circuit past record from the circuit-conversion-past-record storing portion 17 and the information given from the additional-conversion-rule storing portion 15, and gives the analysis result to the analysis-result storing portion 20. Then, the additional-conversion-rule incorporating portion 21 revises the conversion rules given in advance so as to avoid competition between the additional transformation rule and the conversion rules given in advance based on the analysis result given through the storing portion 20, and incorporates the additional transformation rule in the conversion rules given in advance and transmits the resultant conversion rules into the storing portion 13. Incidentally, reference numeral 22 designates a circuit information output portion for outputting information contained in the circuit information storing portion 12.

Next, operation of the logic synthesis apparatus related to the above embodiment is explained with reference to an example of the functional specification.

Figures 2A, 2B:
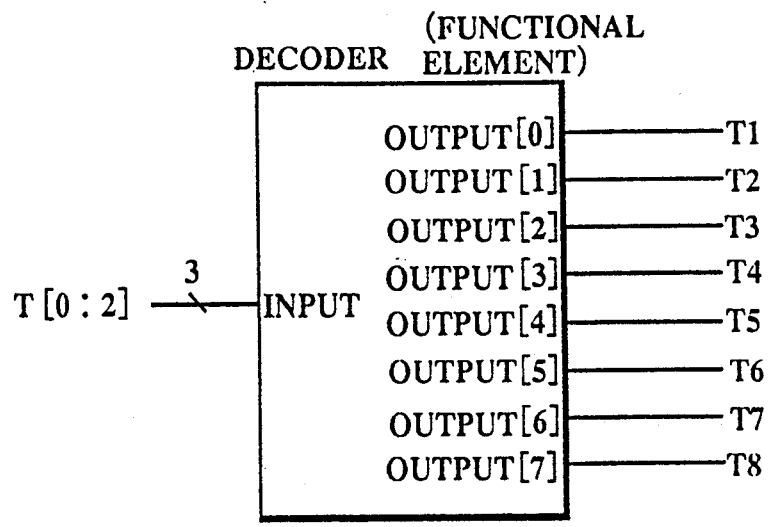
FIGS. 2a and 2b are diagrams to respectively show a functional element decoder and the function thereof related to a functional specification to be inputted to the logic composing apparatus shown in FIG. 1.
Figures 3A, 3B, 4A, 4B:
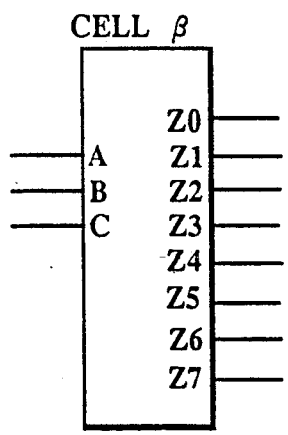
FIGS. 3a and 3b are diagrams to respectively show examples of conversion rules related to the functional element decoder shown in FIGS. 2a and 2b.
FIG. 4a is a diagram to show an example of a cell $\beta$ originally used by each designer.
FIG. 4b is a table of truth value related to the cell $\beta$.

FIGS. 2a and 2b show a functional element decoder included in the functional specification inputted by the circuit information input portion 11. Of these drawings, FIG. 2a shows a circuit construction of the decoder, and FIG. 2b shows a function thereof. When the conversion rules given in advance in the logic synthesis apparatus are so arranged as shown in FIGS. 3a and 3b to the functional element decoder, the functional element decoder inputted is a three-bit type as shown in FIG. 2a. Accordingly, a rule a as shown in FIG. 3a in the storing portion 13 of the conversion rules given advance is applied in the logic composing portion 16, and the functional element decoder is developed into a combination of and/or/not.

Figures 5, 6:
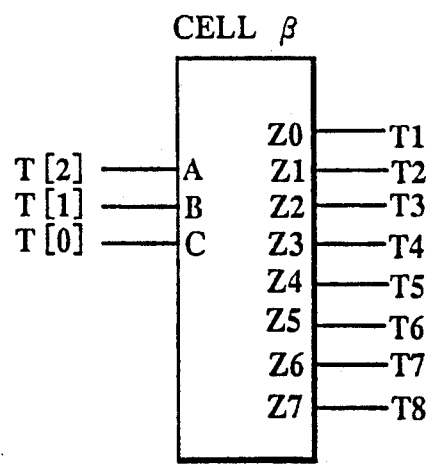
FIG. 5 is a diagram to show an example of an additional transformation rule related to the functional element decoder shown in FIG. 2.
FIG. 6 is a diagram to show an example of a partial circuit obtained by applying the additional transformation rule in FIG. 5 to the cell $\beta$ in FIG. 4.
Figures 7, 8, 9:
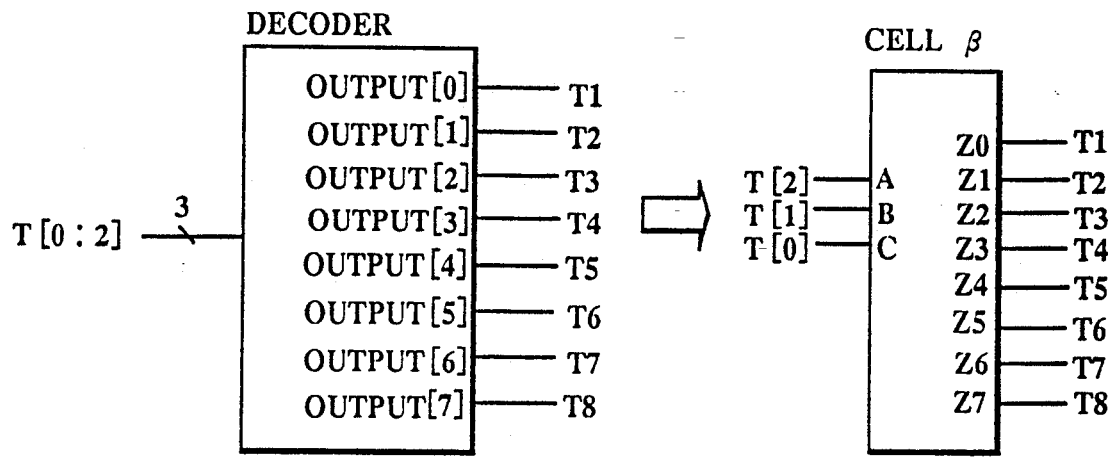
FIG. 7 is a diagram to show a part of a past record of circuit conversion shown in FIG. 6.
FIG. 8 is a diagram to show an example of analysis result of the additional transformation rule based on the result of FIG. 7.
FIG. 9 is a diagram to show an example of conversion rules given in advance to be revised based on the result of FIG. 8.

When a designer attempts to use a cell $\beta$ which is an input decoder cell of a three-bit type originally used by him, and the cell $\beta$ has construction as shown in FIG. 4a and a table of truth value as shown in FIG. 4b, the designer inputs an additional transformation rule c as shown in FIG. 5 from the additional-conversion-rule input portion 14 to store it in the additional-conversion-rule storing portion 15. In this case, when the logic composition process is carried out, since the additional conversion rule is applied to the logic synthesis portion 16 preferentially to the group of conversion rules given in advance to the storing portion 13, the cell $\beta$ arranged as shown in FIG. 6 is assigned to the functional element decoder of FIG. 2a. At the time, a circuit conversion past record as shown in FIG. 7 is stored in the circuit-conversion-past-record storing portion 17. This means that the cell $\beta$ as a three-bit type decoder cell is assigned to the functional element decoder shown in FIG. 2a. Thereafter, the designer monitors a manner in which the additional transformation rule is applied, that is, the circuit conversion past record shown in FIG. 7 from the circuit-conversion-past-record output portion 18. In this case, when he recognizes that the conversion is as expected by him, he carries out learning of the additional transformation rule, that is, the incorporation of the additional transformation rule into the storing portion 13.

The automatic learning of the additional conversion rule is carried out as follows. First, the additional-conversion-rule analyzing portion 19 analyzes the additional transformation rule based on the circuit conversion past record of FIG. 7 and the additional transformation rule contained in the storing portion 15. FIG. 8 shows the analysis result, and the information is given and stored into the analysis result storing portion 20. Then, the additional-conversion-rule incorporating portion 21 incorporates the additional transformation rule into the storing portion 13 of the group of conversion rules given in advance based on the information contained in the storing portion 20 as shown in FIG. 8. However, since these rules are all conversion rules related to the decoder, the rules a and b shown in FIG. 3 are likely to be in a competitive relation with the rule c. Moreover, to be precise in this case, the rule a has a competitive relation with the rule c. Therefore, in the incorporating portion 21, the rule a is revised as shown in FIG. 9 so as to avoid the competition to the rule c. Thereafter, the rule c is stored in the storing portion 13 of the conversion rules given in advance. As the result, the conversion rules related to the decoder and stored in the storing portion 13 are three rules as shown in FIG. 10.

As stated above, since a new transformation rule is incorporated in the logic synthesis apparatus so as to avoid the competition to the rules given in advance, or since the learning of the new transformation rule is executed, the cell $\beta$ is automatically assigned to the decoder having a three-bit input width when the logic composition is executed.

FIG. 11 is a flow-chart to show a procedure for executing the logic composition using the additional transformation rule as said above.

In the same drawing, logic composition is executed using the conversion rules given in advance to the functional specification inputted, and a logic circuit already composed is examined in a step 30, then whether it is necessary to revise the logic circuit or not is discriminated in a step 31. When it is not necessary to revise the circuit, the process of logic composition is ended at a step 32. While, when the revision is required, the additional transformation rule is prepared and inputted at step 33. Then, the logic composition is executed again so that the additional transformation rule inputted is preferentially applied at a step 34. Subsequently, the logic circuit composed and the circuit conversion past record are examined by monitoring with the output portions 18, 22 at a step 35, then it is examined whether the logic circuit is as expected and the additional transformation rule is actually applied at a step 36. If the logic circuit is not obtained in the required form, and the additional transformation rule is not suitably applied, the flow returns to the step 33 so as to prepare and input a new additional transformation rule. While, when the circuit satisfies the request of the designer at the step 36, the conversion rules given in advance are revised so as to avoid the competition between the additional conversion rule and the conversion rules given in advance by analyzing the additional transformation rule inputted and the additional transformation rule is incorporated in the group of the conversion rules given in advance, that is, the learning of the additional transformation rule is executed at a step 37. Thereafter, the logic composition process is ended at a step 38.

As described in above explanation with reference to the embodiment, according to the present invention, the additional transformation rule which is originally given by a circuit designer can be inputted without causing any competition to the conversion rules given in advance, so as to execute the logic composition. Accordingly, it is becomes very easy for the circuit designer to compose the logic circuit along his original designing way. Moreover, with respect to the inputted additional transformation rule, the automatic learning process for incorporating it to the group of conversion rules given in advance is automatically carried out. Accordingly, once the process is executed, the logic composition based on the additional rule is successively executed only by inputting a functional specification. Thus, according to the logic composing apparatus of the present invention, the trouble to be imposed on the designer for incorporating the additional rule can be markedly reduced as compared with the prior art.

Various modifications will become more possible for those skilled in the art after receiving the teachings of the present disclosure without departing from the scope thereof.

What is claimed is:

1. A logic synthesis apparatus for automatically synthesizing and designing a logic circuit by transforming a functional specification based on transformation rules stored in a knowledge base, comprising:
    means for inputting the functional specification into the apparatus;
    means for inputting a designer's own additional transformation rule;
    means for executing logic synthesis by giving priority to the inputted additional transformation rule over the knowledge base, wherein the inputted additional transformation rule is applied to the functional specification; and
    means for revising the transformation rules stored in the knowledge base so as to avoid competition between the transformation rules stored in the knowledge base and the additional transformation rule of the designer's own by analyzing the additional transformation rule, and for incorporating the additional transformation rule into the knowledge base, and
    wherein the means for executing logic synthesis has a function of outputting a transformation record which records a result after the transformation rules are applied, and wherein
    the means for incorporating the additional transformation rule into the knowledge base includes,
        a transformation-record-storing portion for storing a transformation result after the transformation rules are applied,
        an additional transformation-rule analyzing portion for analyzing a function of the additional transformation rule based on the transformation result stored in the transformation-record-storing portion,
        an analysis-result-storing portion for storing a result of analysis, and an additional-transformation-rule incorporating portion for revising the transformation rules stored in the knowledge base so as to avoid competition between the transformation rules stored in the knowledge base and the additional transformation rule based on the result of analysis, and, thereafter, incorporating the additional transformation rule into the knowledge base.

2. The logic synthesis apparatus according to claim 1, further comprising:

output means for outputting contents of the transformation-record-storing portion so as to monitor the logic synthesis and the application of transformation rules.

3. A method of processing logic synthesis, comprising the steps of:

(a) executing logic synthesis to design a circuit by applying transformation rules stored in a knowledge base to a functional specification of the circuit, thereby generating a synthesized circuit;

(b) examining the synthesized circuit obtained at step (a) and judging whether the synthesized circuit requires modification;

(c) ending a process of the logic synthesis when the modification is not required in step (b);

(d) generating an additional transformation rule for a specific purpose and executing logic synthesis on the functional specification by applying the additional transformation rule, the additional transformation rule being given priority over the knowledge base, when the modification is required in step (b), thereby generating an additional synthesized circuit;

(e) examining the additional synthesized circuit obtained at step (d) and judging whether the additional synthesized circuit is satisfactory;

(f) ending the process of logic synthesis when the additional synthesized circuit is judged to be satisfactory in step (e);

(g) revising the transformation rules stored in the knowledge base so as to avoid competition between the transformation rules stored in the knowledge base and the additional transformation rule by analyzing the additional transformation rule; and (h) incorporating the additional transformation rule into the knowledge base, wherein the step for executing logic synthesis outputs a transformation record which records a result after the transformation rules are applied, and wherein the step for incorporating the additional transformation rule into the knowledge base includes the steps of, storing in a transformation-record-storing portion a transformation result after the transformation rules are applied, analyzing a function of the additional transformation rule based on the transformation result stored in the transformation-record-storing portion in an additional-transformation-rule analyzing portion, storing in an analysis-result-storing portion a result of analysis, and revising in an additional-transformation-rule incorporating portion the transformation rules stored in the knowledge base so as to avoid competition between the transformation rules stored in the knowledge base and the additional transformation rule based on the result of analysis, and thereafter incorporating the additional transformation rule into the knowledge base.

* * * * *